United States Patent
Sohn et al.

(10) Patent No.: US 7,193,903 B2
(45) Date of Patent: Mar. 20, 2007

(54) METHOD OF CONTROLLING AN INTEGRATED CIRCUIT CAPABLE OF SIMULTANEOUSLY PERFORMING A DATA READ OPERATION AND A DATA WRITE OPERATION

(75) Inventors: Kyo-Min Sohn, Seongnam-si (KR); Young-Ho Suh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 121 days.

(21) Appl. No.: 10/811,613

(22) Filed: Mar. 29, 2004

(65) Prior Publication Data

US 2004/0208064 A1    Oct. 21, 2004

(30) Foreign Application Priority Data

Apr. 15, 2003    (KR) .................. 10-2003-0023732

(51) Int. Cl.
*G11C 7/10* (2006.01)
(52) U.S. Cl. ............. 365/189.04; 365/233; 365/230.08
(58) Field of Classification Search ........... 365/189.04, 365/233, 230.08, 230.03, 199, 189.01
See application file for complete search history.

(56) References Cited

U.S. PATENT DOCUMENTS 4,727,481 A * 2/1988 Aguille et al. .............. 711/217

5,842,169 A * 11/1998 Sakashita .................... 704/278
6,327,645 B1 * 12/2001 Hsiao et al. ................ 711/140
2004/0085817 A1 * 5/2004 Kim et al. ............. 365/189.01
2005/0018521 A1 * 1/2005 Lee et al. .............. 365/230.03

FOREIGN PATENT DOCUMENTS

KR    2004-0036477    4/2004

* cited by examiner

*Primary Examiner*—Anh Phung
*Assistant Examiner*—Dang Nguyen
(74) *Attorney, Agent, or Firm*—F. Chau & Associates, LLC

(57) ABSTRACT

A method of controlling an integrated circuit (IC) capable of simultaneously performing a data read operation and a data write operation is provided. The method comprises (a) receiving a write address, a read address, and write data, (b) determining, a memory block and a data memory block in which a data read operation and a data write operation are to be performed in response to the write address and the read address, (c) performing the data read operation or the data write operation in the data memory block according to the determination of step (b), and (d) performing the data read operation or the data write operation in the memory block according to the determination of step (b).

17 Claims, 9 Drawing Sheets

METHOD OF CONTROLLING AN INTEGRATED CIRCUIT CAPABLE OF SIMULTANEOUSLY PERFORMING A DATA READ OPERATION AND A DATA WRITE OPERATION

CROSS-REFERENCE TO RELATED APPLICATIONS

This application claims priority of Korean Patent Application No. 2003-23732, filed on Apr. 15, 2003, in the Korean Intellectual Property Office, the disclosure of which is incorporated herein by reference.

BACKGROUND OF THE INVENTION

1. Technical Field

The present invention relates to a method of controlling an integrated circuit (IC), and more particularly, to a method of controlling an IC, which has separate inputs and outputs (I/Os), and is capable of simultaneously performing a data read operation and a data write operation.

2. Discussion of the Related Art

General synchronous random access memories (SRAMS) can transmit either read data or write data during each period of a clock signal. A double data rate (DDR) RAM increases a data transmission rate of an SRAM by transmitting data at both a rising edge and a falling edge of a clock signal. However, in a conventional memory device such as an SRAM, data input and data output are performed via one input and output (I/O) pin. When using a common I/O pin, data that is input and output cannot be independently controlled. Thus, input and output frequencies of the data (e.g., bandwidth) are limited.

As the bandwidth of a memory device becomes important, memory devices using separate I/Os have been manufactured. In such memory devices, an input pin and an output pin are positioned separately so data that is input and output can be independently controlled. A memory device that has separate input and output pins can receive a read command, a read address, a write command, a write address, and can write data within one period of a clock signal, thus increasing its operating frequency.

However, when a memory device having separate I/Os receives a read command, a read address, a write command, a write address, and write data within one period of a clock signal, memory cell accesses are performed twice, resulting in a data read operation and a data write operation being performed within one period of a clock signal. Thus, because the activation of a word line for data reading and data writing is performed twice within one period of a clock signal, the clock frequency is limited by the activation time of a word line.

FIG. 1 is a timing diagram illustrating an operation of a memory device having separate I/Os. Because the relationship between an address and a word line or the latency of input data and output data vary according to the structure of the memory device, such a relation or latency is not discussed.

Referring to FIG. 1, a write address WADD and a read address RADD are input within one period of a clock signal CLK. Addresses A0, A2, A4, and A6 input at a rising edge of the clock signal CLK are read addresses RADDs, and addresses A1, A3, A5, and A7 input at a falling edge of the clock signal CLK are write addresses WADDs. A read selection signal RES is used to select the read address RADDs, and a write selection signal WES is used to select the write address WADD, respectively. A word line WL having a world line pulse AWL0 for data reading and a word line pulse AWL1 for data writing is activated within one period of the clock signal CLK. Thus, one period of the clock signal CLK cannot be shorter than the activation time of the word line WL.

SUMMARY OF THE INVENTION

According to an aspect of the present invention, there is provided a method of controlling an integrated circuit (IC) to which inputs and outputs (I/Os) are separately provided and to which a write address and a read address are simultaneously input during one period of a clock signal, the method comprising (a) receiving a write address, a read address, and write data; (b) determining, a memory block and a data memory block in which a data read operation and a data write operation are to be performed in response to the write address and the read address; (c) performing the data read operation or the data write operation in the data memory block according to the determination of step (b); and (d) performing the data read operation or the data write operation in the memory block according to the determination of step (b).

Step (b) is performed by a tag memory controlling unit. Step (d) further comprises (d1) when the data read operation is performed, transmitting the read data to a transmitting unit corresponding to a sub-memory block inside the memory block; (d2) transmitting the data transmitted to an output buffer; and (d3) outputting the data transmitted to the output buffer.

Steps (a) through (d) each represent a stage of a pipeline in a pipeline structure in which an operation of the IC is performed. At least one stage operates during one period of a clock signal or during several periods of the clock signal.

Step (c) further comprises writing information regarding the data read or write operation performed in the data memory block to the tag memory controlling unit. In step (b), the information and an address of a tag memory in which the information is to be written are temporarily stored in a register before the information is written to the tag memory controlling unit, and when a newly-received write or read address is coincident with the address of the tag memory in which the information is to be written, a subsequent operation is performed using the information stored in the register.

As a result of step (b), when the operation of step (c) is not performed, the operation of step (d) is not performed at a stage corresponding to step (c), and no operation is performed at the stage corresponding to step (c).

If the upper addresses of the received write address and read address are the same, the read address and the write address are not the same as a data memory address and data stored in the data memory block corresponding to the write address is valid, step (c) further comprises (c1) reading data stored in the data memory block corresponding to the write address; and (c2) writing write data corresponding to the write address to the data memory block from which the data is read, and step (d) further comprises (da) performing a data read operation in a sub-memory block corresponding to the read address; and (db) writing the read data to a sub-memory block in which data read in step (c1) is stored.

Step (c2) further comprises (c21) writing the information regarding the write data written to the data memory block from which the data is read to the tag memory controlling unit. The data memory address is an address of the sub-memory block corresponding to the data memory block.

According to another aspect of the present invention, the IC comprises a plurality of the memory blocks, each of the memory blocks comprising a plurality of sub-memory blocks, the data memory blocks corresponding to the memory blocks, and a tag memory controlling unit, wherein the tag memory controlling unit writes data to the memory blocks or reads data from the memory blocks in response to the write address or the read address.

According to yet another aspect of the present invention, a method for performing a write operation and a read operation in an IC comprising a separate I/O, comprises: receiving a write address, a read address and a write data command during a period of a clock signal; determining, a first memory location and a second memory location, where a write operation and a read operation are to be performed in response to the write address and the read address; and performing the write operation in one of the first memory location and the second memory location and the read operation one of the first memory location and the second memory location. The first memory location is a memory block and the second memory location is a data memory block and the determination step is performed by a memory controlling unit.

The determination step further comprises: determining if the write address and the read address are input; determining if an upper address of the write address is coincident with an upper address of the read address; determining if the write address and the read address are coincident with a data memory address; and determining if data stored in one of the first memory location and the second memory location is valid data.

The performing step further comprises: performing the write operation or the read operation in one of the first memory location and the second memory location, when the operation to be performed corresponds to the address coincident with the data memory address; performing the read operation in one of the first memory location and second memory location, when the write address and the read address are coincident with the data memory address; storing new data in one of the first memory location and the second memory location, when data stored in one of the first memory location and the second memory location is valid data; and writing the new data to one of the first memory location and the second memory location, when data stored in one of the first memory location and the second memory location is not valid data and performing the write operation or the read operation in a third memory location, when the operation to be performed corresponds to the address not coincident with the data memory address; performing the write operation in the third memory location, when the write address and the read address are coincident with the data memory address; storing new data in one of the first memory location and the second memory location, when data stored in one of the first memory location and the second memory location is valid data; and writing the new data to one of the first memory location and the second memory location, when data stored in one of the first memory location and the second memory location is not valid data. The third memory location is a sub-memory block.

BRIEF DESCRIPTION OF THE DRAWINGS

The aspects of the present invention will become more apparent by describing in detail exemplary embodiments thereof with reference to the attached drawings, in which.

DETAILED DESCRIPTION OF EXEMPLARY EMBODIMENTS

Figure 1:
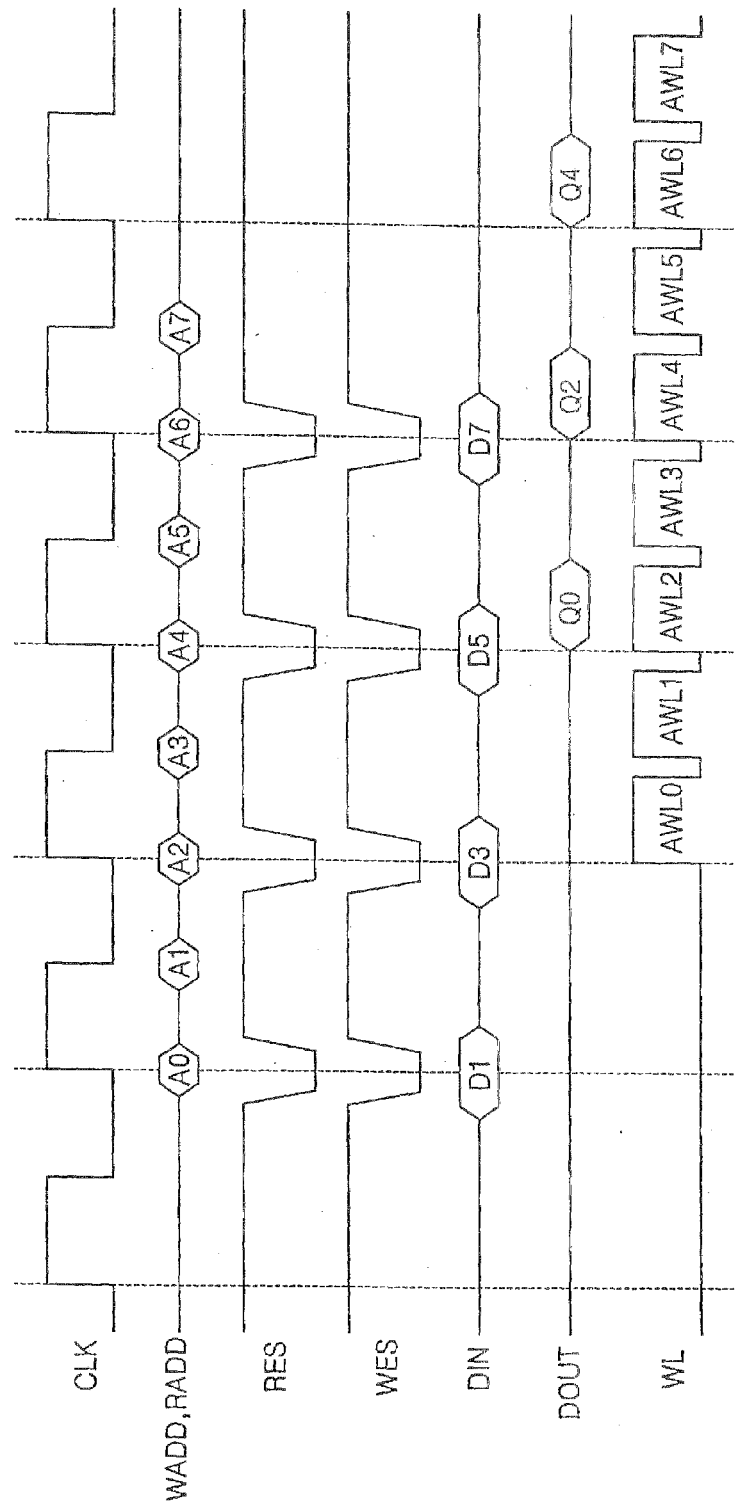
FIG. 1 is a timing diagram illustrating an operation of a memory device having separate inputs and outputs (I/Os)
Figure 2:
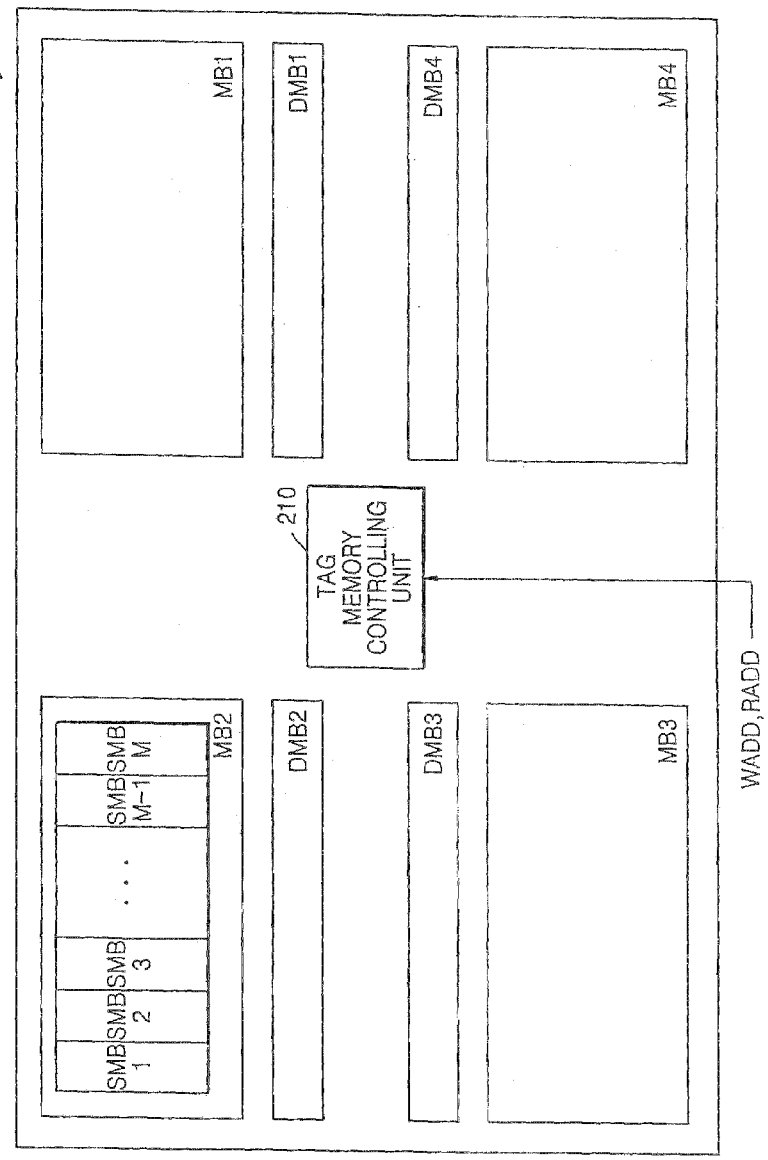
FIG. 2 is a block diagram illustrating an integrated circuit (IC) according to an exemplary embodiment of the present invention.

FIG. 2 is a block diagram illustrating an integrated circuit (IC) according to an exemplary embodiment of the present invention. Referring to FIG. 2, the (IC) 200 includes memory blocks MB1, MB2, MB3, and MB4, each of the memory blocks MB1, MB2, MB3, and MB4 includes a plurality of sub-memory blocks SMB1, SMB2, SMB3 . . . SMB M−1, and SMB M (illustrated in memory block MB2). The IC 200 also includes data memory blocks DMB1, DMB2, DMB3, and DMB4 corresponding to the memory blocks MB1, MB2, MB3, and MB4, respectively, and a tag memory controlling unit 210.

In the IC 200, separate inputs and outputs (I/Os) (not shown) are configured so that there is one input pin and one output pin, and a write address WADD and a read address RADD are input during one period of a clock signal.

The memory blocks MB1, MB2, MB3, and MB4 each have the same or similar structure, and the data memory blocks DMB1, DMB2, DMB3, and DMB4 each have the same or similar structure. Thus, in an effort to avoid repetition, the memory block MB2 (i.e., the second memory block) of the memory blocks MB1, MB2, MB3, and MB4 and the data memory block DMB2 (i.e., the second data memory block) of the data memory blocks DMB1, DMB2, DMB3, and DMB4 will be described below.

The write address WADD and the read address RADD are each divided into an upper address and a lower address, and the upper address is an address that defines one address selected from a plurality of sub-memory blocks. In accordance with the present invention, when the write address WADD and the read address RADD are the same, a data read operation and a data write operation are simultaneously performed in a memory block (e.g., MB2) and a data memory block (e.g., DMB2) so that a period of a clock signal is reduced. In other words, when the write address WADD and the read address RADD are the same, the data write operation and the data read operation are simultaneously performed in one sub-memory block (e.g., SMB2). Thus, if the data read operation is performed in the sub-memory block SMB2, the data write operation is performed in the data memory block DMB2 corresponding to the sub-memory block SMB2.

Conversely, if the data write operation is performed in the sub-memory block SMB2, the data read operation is performed in the data memory block DMB2 corresponding to the sub-memory block SMB2. In this manner, the data read operation and the data write operation are performed simultaneously and in parallel. Thus, a period of a clock signal is reduced.

Accordingly, a predetermined memory cell of the sub-memory block SMB2 is directly-mapped to a predetermined memory cell of the data memory block DMB2. In addition, the data write operation and the data read operation are continuously performed in the same sub-memory block. Thus, the size of a data memory block (e.g., DMB2) should be the same as or larger than the size of a sub-memory block (e.g., SMB2).

The tag memory controlling unit 210 determines whether the data write operation or the data read operation is performed in the sub-memory block SMB2 or the data memory block DMB2. The tag memory controlling unit 210 reads data stored in the memory blocks MB1, MB2, MB3, and MB4 and the data memory blocks DMB1, DMB2, DMB3, and DMB4 or writes data in the memory blocks MB1, MB2, MB3, and MB4 and the data memory blocks DMB1, DMB2, DMB3, and DMB4 in response to the write address WADD or the read address RADD.

When the write address WADD is the same as the read address RADD and the data read operation is performed in the sub-memory block SMB2 of the memory block MB2 and the data write operation is performed in the data memory block DMB2, an address of the sub-memory block SMB2 in which the data written in the data memory block DMB2 is originally written, is stored in the tag memory controlling unit 210 as a data memory address. Thus, the data memory address is an upper address that defines the sub-memory block SMB2 in which the data stored in the data memory block DMB2 is originally stored. In order to recognize the data memory address stored in the tag memory controlling unit 210, the position of the data memory address stored in the tag memory controlling unit 210 is identified by a low address among input addresses.

When a subsequent write address WADD is the same as a subsequent read address RADD and the previous write address WADD is the same as the previous read address RADD, the data write operation is performed in the data memory block DMB2. In this case, data that is initially written in the data memory block DMB2 is determined to see whether it is valid data. If the data is valid data, the data initially written in the data memory block DMB2 is read and written in a sub-memory block corresponding to the memory block MB2, and data corresponding to the next write address WADD is written in the data memory block DMB2. Information obtained after determining whether the data stored in the data memory block DMB2 is valid is stored in the tag memory controlling unit 210.

When the write address WADD is different from the read address RADD, two different sub-memory blocks corresponding to the write and read addresses WADD and RADD are decoded. Accordingly, in the IC 200 a write address decoding path (not shown) and a read address decoding path (not shown) are separate. The sub-memory blocks SMB1, SMB2, SMB3 . . . SMB M–1, and SMB M are connected to the write address decoding path and the read address decoding path and, data is input or output via an input pin or an output pin at a single data rate (SDR) or a double data rate (DDR).

Figure 3A:
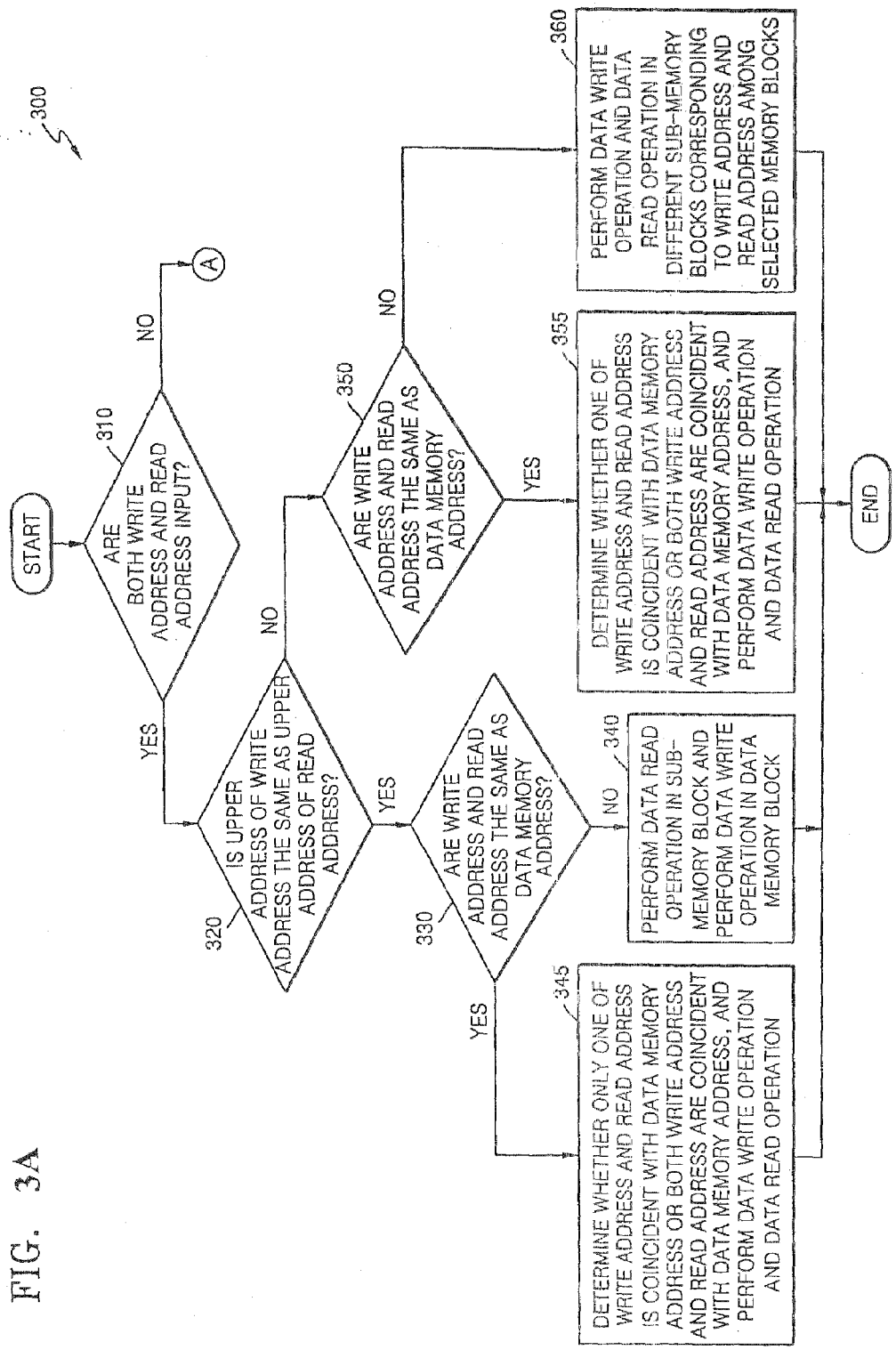
FIGS. 3A and 3B include a flowchart illustrating a method of simultaneously performing data read and write operations using the IC shown in FIG. 2 according to an exemplary embodiment of the present invention.
Figure 3B:
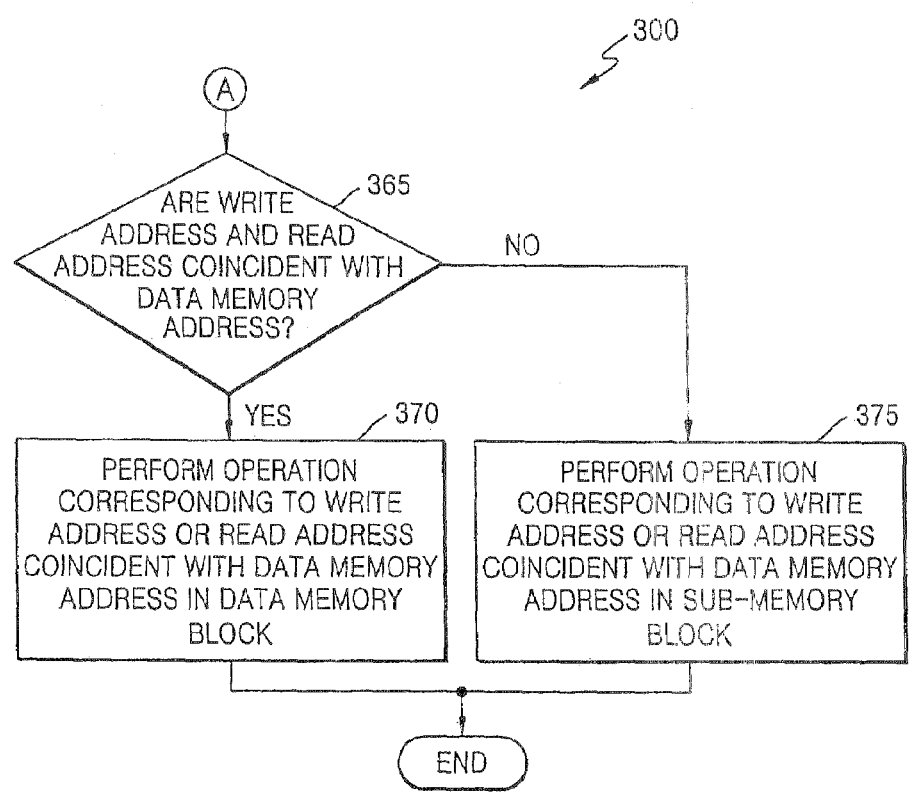

FIGS. 3A and 3B include a flowchart illustrating a method of simultaneously performing data read and write operations using the IC 200 according to an exemplary embodiment of the present invention. In process 310, it is determined whether both a write address and a read address are input or if the write address or the read address is input during one period of a clock signal. The tag memory controlling unit 210 then receives a write address WADD and a read address RADD via, for example, an input pin separate from an output pin. If the write address WADD and the read address RADD are input during one period of a clock signal, in process 320, it is determined whether an upper address of the write address WADD is the same as an upper address of the read address RADD.

The write address WADD or the read address RADD has information that is used to define a sub-memory block in upper bits. Thus, if the write address WADD or the read address RADD is input, the upper address of the write address WADD or the read address RAD is recognized, and it is determined what sub-memory block is to be defined. If the upper address of the write address WADD is the same as the upper address of the read address RADD, in process 330, it is determined whether the write address WADD and the read address RADD are the same as a predetermined data memory address.

If the upper address of the write address WADD is the same as the upper address of the read address RADD, the Write address WADD and the read address RADD define the same sub-memory block. In this case, a data write operation or a data read operation is performed in a sub-memory block, and the other operation (e.g., a data write or a data read) is performed in a data memory block.

The tag memory controlling unit 210 stores a data memory address. The data memory address represents an address of a sub-memory block SMB2 corresponding to, for example, a data memory block DMB2. If the write address WADD is the same as the data memory address, the data write operation is performed in the data memory block DMB2.

If one of the write address WADD and the read address RADD is not the same as the data memory address, in process 340, the data read operation is performed in the sub-memory block corresponding to the read address RADD, and the data write operation is performed in the data memory block.

Figure 4:
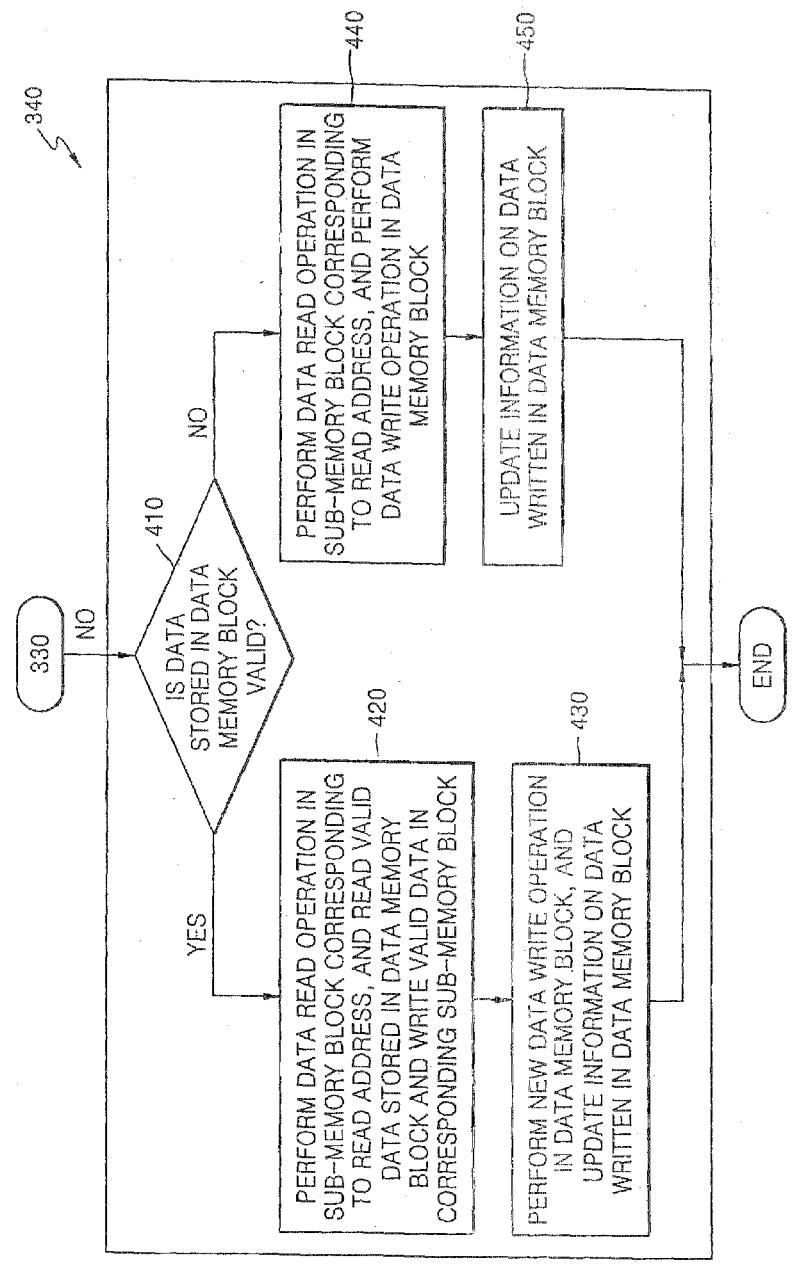
FIG. 4 is a flowchart illustrating process 340 shown in FIG. 3A.

Process 340 will be described in greater detail with reference to FIG. 4. If the write address WADD or the read address RADD is not the same as the data memory address, in process 410, it is determined whether data stored in the data memory block is valid. If the write address WADD or the read address RADD is not the same as the data memory address, this indicates that the data read operation and the data write operation is to be performed in the sub-memory block SMB2 of the memory block MB2. However, a write word line and a read word line cannot be simultaneously enabled in the same sub-memory block. Thus, the data memory block DMB2 is used.

If the data stored in the data memory block is not valid, in process 440, the data read operation is performed in the sub-memory block corresponding to the read address RADD, and the data write operation is performed in the data memory block. When the data write operation and the data read operation are performed in the same sub-memory block, the data read operation is performed first. Thus, the data read operation is performed in the sub-memory block SMB2 of the memory block MB2 corresponding to the read address RADD. Because the data stored in the data memory block DMB2 is not valid, the data write operation is performed in the data memory block DMB2.

Because the data stored in the data memory block DMB2 is changed by a new data write operation, in process 450, information regarding the data written in the data memory block is updated. Updating of the information is performed by the tag memory controlling unit 210.

If the data stored in the data memory block is valid, in process 420, the data read operation is performed in the sub-memory block corresponding to the read address RADD, and the valid data stored in the data memory block is read and written in the corresponding sub-memory block. When the data write operation and the data read operation are performed in the same sub-memory block, the data read operation is performed first. Thus, the data read operation is performed in the sub-memory block SMB2 of the memory block MB2 corresponding to the read address RADD. Because the data stored in the data memory block DMB2 is valid data, the valid data stored in the data memory block DMB2 should be read, and the read data is written in the corresponding sub-memory block SMB2 of the memory block MB2.

In process 430, a new data write operation is performed in the data memory block DMB2, and information regarding the data written in the data memory block DMB2 is updated. Updating of the information is performed by the tag memory controlling unit 210.

The data write operation and the data read operation are simultaneously performed. In other words, because the data write operation and the data read operation are independently performed in the sub-memory block SMB2 and the data memory block DMB2, the write word line and the read word line can be simultaneously enabled. Thus, the write word line and the read word line are sequentially enabled such that the period of a clock signal is not limited.

If the write address WADD or the read address RADD is coincident with the data memory address in process 330, in process 345, it is determined whether only one of the write address WADD and the read address RADD is coincident with the data memory address or if both the write address WADD and the read address RADD are coincident with the data memory address, the data write operation and the data read operation are performed.

Figure 5:
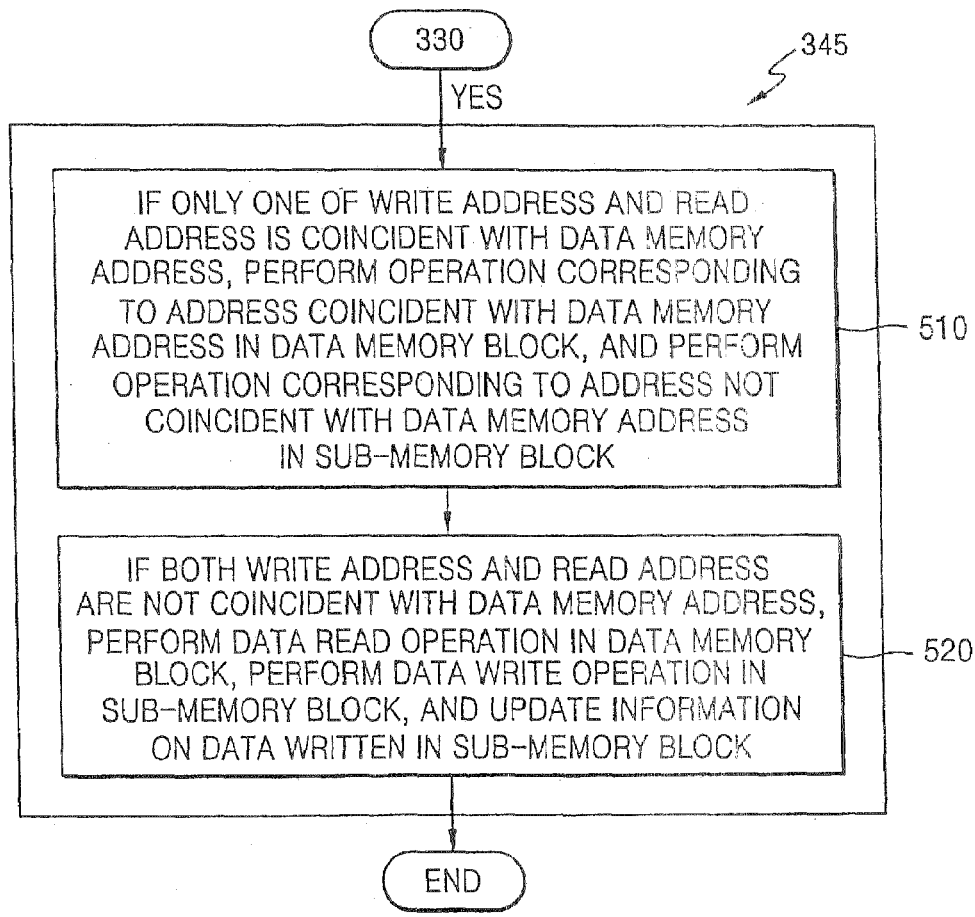
FIG. 5 is a flowchart illustrating process 345 shown in FIG. 3A.

Process 345 will be described in greater detail with reference to FIG. 5. If the write address or the read address is coincident with the data memory address, in process 510, an operation corresponding to an address coincident with the data memory address is performed in the data memory block DMB2, and an operation corresponding to an address not coincident with the data memory address is performed in the sub-memory block SMB2. In other words, if the read address RADD is coincident with the data memory address and the write address WADD is not coincident with the data memory address, the data read operation is performed in the data memory block DMB2.

Conversely, if the write address WADD is coincident with the data memory address and the read address RADD is not coincident with the data memory address, the data write operation is performed in the data memory block DMB2, and the data read operation is performed in the memory block MB2.

If the write address WADD and the read address RADD are not coincident with the data memory address, in process 520, the data read operation is performed in the data memory block DMB2, the data write operation is performed in the sub-memory block SMB2, and information on the data written in the sub-memory block SMB2 is updated. If, however, the write address WADD and the read address RADD are coincident with the data memory address, the data write operation and the data read operation should be performed in the data memory block DMB2.

This, however, does not occur because the data write operation and the data read operation cannot be simultaneously performed in the same sub-memory block. Thus, the data read operation is performed in the data memory block DMB2 and, the data write operation is performed in the corresponding sub-memory block SMB2 of the memory block MB2.

Because the data to be originally written in the data memory block DMB2 is written in the sub-memory block SMB2, the data being currently stored in the data memory block DMB2 is not valid data. Thus, this information is updated by the tag memory controlling unit 210.

In process 320, if the upper address of the write address WADD is not the same as the upper address of the read address RADD, in process 350, it is determined whether the write address WADD and the read address RADD are coincident with the data memory address. In process 355, it is determined whether one of the write address WADD and the read address RADD is coincident with the data memory address or both the write address WADD and the read address RADD are coincident with the data memory address, then the data write operation and the data read operation are performed.

Figure 6:
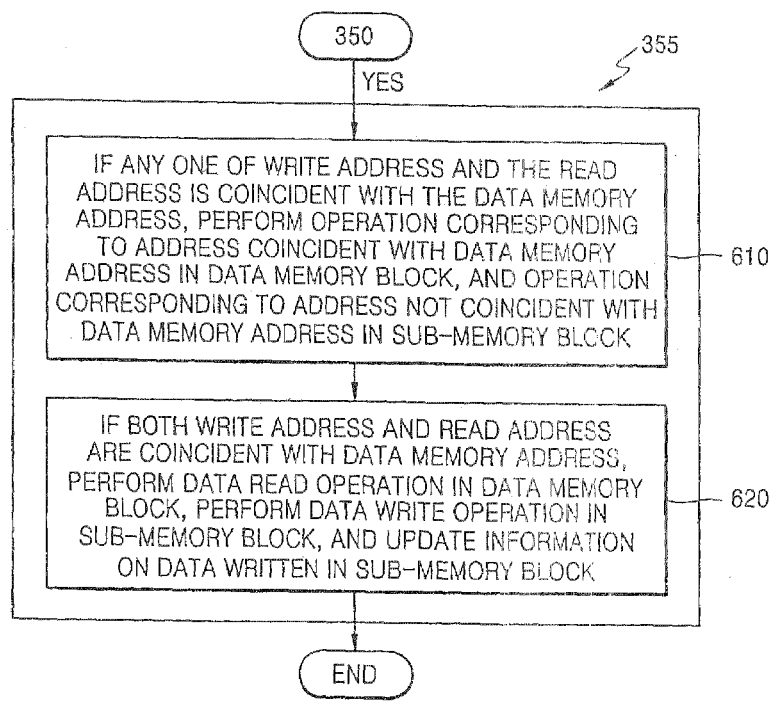
FIG. 6 is a flowchart illustrating process 355 shown in FIG. 3A.

Process 355 will be described in greater detail with reference to FIG. 6. If any one of the write address WADD and the read address RADD is coincident with the data memory address, in process 610, an operation corresponding to an address coincident with the data memory address is performed in the data memory block DMB2, and an operation corresponding to an address not coincident with the data memory address is performed in the sub-memory block SMB2. In other words, if the read address RADD is coincident with the data memory address and the write address WADD is not coincident with the data memory address, the data read operation is performed in the data memory block DMB2. In addition, the tag memory controlling unit 210 performs the data write operation in the sub-memory block SMB2.

Conversely, if the write address WADD is coincident with the data memory address and the read address RADD is not coincident with the data memory address, the data write operation is performed in the data memory block DMB2, and the data read operation is performed in the sub-memory block SMB2.

If both the write address WADD and the read address RADD are coincident with the data memory address, in process 620, the data read operation is performed in the data memory block DMB2, the data write operation is performed in the sub-memory block SMB2, and information on the data written in the sub-memory block SMB2 is updated.

If both the write address WADD and the read address RADD are coincident with the data memory address, the data write operation and the data read operation are performed in the data memory block DMB2. However, because the data write operation and the data read operation cannot be simultaneously performed in the same sub-memory block, the data read operation is performed in the data memory block DMB2 and, the data write operation is performed in the corresponding sub-memory block SMB2 of the memory block MB2.

Because the data that was to be originally written in the data memory block DMB2 is written in the sub-memory block SMB2, the data currently stored in the data memory block DMB2 is not valid data. Thus, the information is updated by the tag memory controlling unit 210.

As a result of the determination in process 350, if the write address WADD and the read address RADD are not coincident with the data memory address, in process 360, a data write operation and a data read operation are performed in different sub-memory blocks corresponding to the write address WADD and the read address RADD among the selected memory blocks. In this case, the write address WADD and the read address RADD define different sub-memory blocks. Because the different sub-memory blocks are defined, a data read operation and a data write operation are performed using a decoding circuit (not shown) corresponding to each sub-memory block.

In process 310, if any one of the write address and the read address is input, in process 365, it is determined whether one of the write address WADD and the read address RADD is coincident with the data memory address. If the input write address WADD or read address RADD is coincident with the data memory address, in process 370, an operation corresponding to the write address WADD or read address RADD coincident with the data memory address is performed in the data memory block DMB2.

In this case, the write address WADD or the read address RADD is input during one period of a clock signal. If the input address is coincident with the data memory address, the operation corresponding to the data memory block DMB2 is performed, and if the input address is not coincident with the data memory address, the operation corresponding to the sub-memory block SMB2 is performed. In other words, if only the write address WADD is input and the input write address WADD is coincident with the data memory address, the data write operation is performed in the data memory block DMB2. Conversely, if only the read address RADD is input and the input read address RADD is coincident with the data memory address, the data read operation is performed in the data memory block DMB2.

If the input write address WADD or read address RADD is not coincident with the data memory address, in process 375, an operation corresponding to the write address WADD or read address RADD not coincident with the data memory address is performed in the sub-memory block SMB2.

Figure 7:
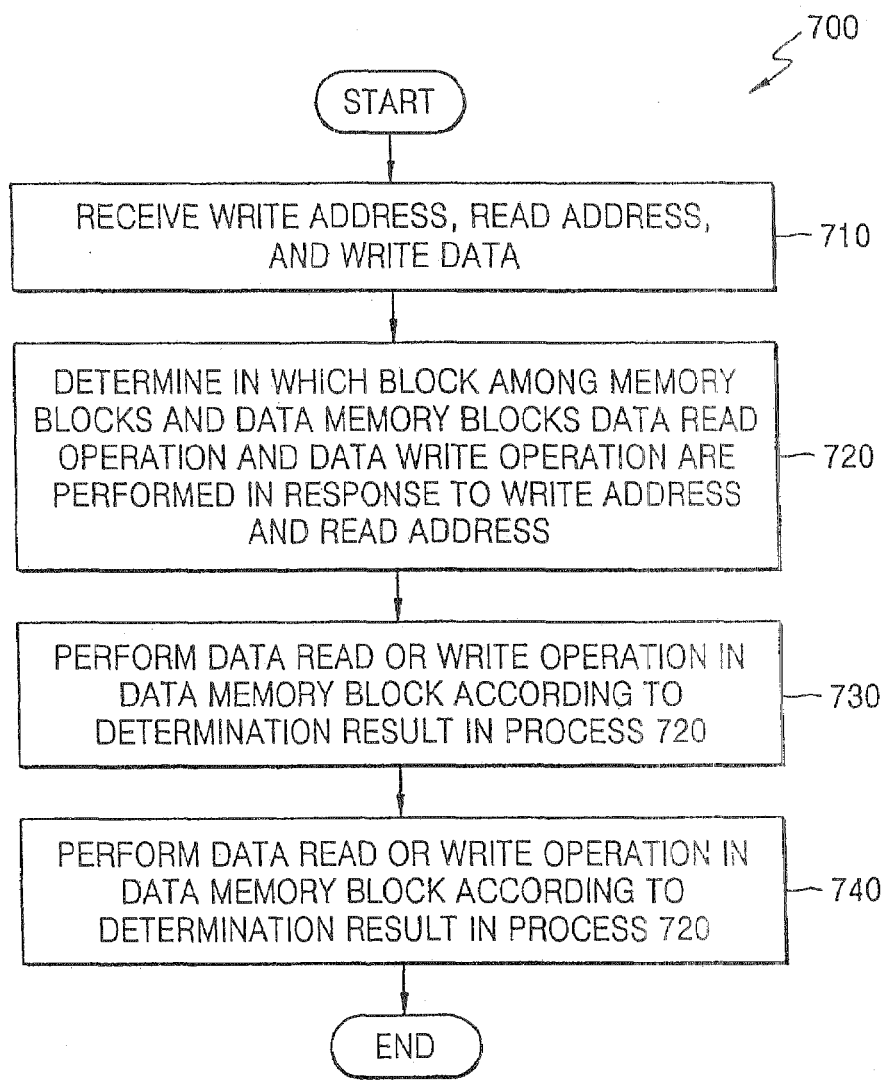
FIG. 7 is a flowchart illustrating an operation of an IC according to an exemplary embodiment of the present invention.

FIG. 7 is a flowchart 700 illustrating an operation of an IC, for example, the IC 200, according to an exemplary embodiment of the present invention. In particular, the flowchart 700 of FIG. 7 illustrates an order in which a variety of operations is smoothly performed within a short period of time during a clock signal.

Referring to FIG. 7, in process 710, a write address (e.g., WADD), a read address (e.g., RADD), and a write data are received. In process 720, it is determined in which blocks (among the memory blocks and the data memory blocks) a data read operation and a data write operation are performed in response to the write address and the read address. Specifically, in process 720, it is determined whether both the write address and the read address are input (e.g., as in process 310), it is determined whether an upper address of the write address is coincident with an upper address of the read address (e.g., as in process 320), it is determined whether the write address and the read address are coincident with a data memory address (e.g., as in processes 330, 350, and 365), and it is determined whether data stored in a data memory block is valid (e.g., as in process 410).

The operation of process 720 is performed by, for example, the tag memory controlling unit 210 of FIG. 2. The tag memory controlling unit 210 controls an operation of writing data in a sub-memory block or a data memory block or an operation of reading data from the sub-memory block or the data memory block.

In process 730, the data read or write operation is performed in the data memory block according to the determination result from process 720. In process 730, an operation corresponding to an address coincident with the data memory address among the write address and the read address is performed in the data memory block (e.g., as in processes 510 and 610), and if both the write address and the read address are coincident with the data memory address, a data read operation is performed in the data memory block (e.g., as in processes 520 and 620).

In addition, in process 730, if data stored in the data memory block is valid data, the valid data stored in the data memory block is read and new data is stored in the data memory block (e.g., as in processes 420 and 430), and if the data stored in the data memory block is not valid data, new data is written in the data memory block (e.g., as in process 440). In process 730, writing information during a data read or write operation performed in the data memory block in the tag memory controlling unit 210 can also be performed. In other words, when the data stored in the data memory block is changed, information regarding the changed data is updated with tag memory information.

In process 740, the data read or write operation is performed in the data memory block according to the determination result from process 720. In process 740, an operation corresponding to an address not coincident with the data memory address among the write address and the read address is performed in the sub-memory block (e.g., as in processes 510 and 610), and if both the write address and the read address are coincident with the data memory address, a data write operation is performed in the sub-memory block (e.g., as in processes 520 and 620).

In addition, in process 740, if data stored in the data memory block is valid data, the valid data stored in the data memory block is read and new data is stored in the data memory block (e.g., as in process 420), and if the data stored in the data memory block is not valid data, new data is written in the data memory block (e.g., as in process 440).

As described with reference to FIG. 7, after the write address, the read address, and the write data are received, an operation for the tag memory controlling unit 210 is performed first, an operation for the data memory block is performed, and an operation for the sub-memory block is performed.

Each process of FIG. 7 corresponds to a stage of a pipeline in a pipeline structure in which an IC such as the IC 200 operates. In other words, an IC operating in accordance with an exemplary embodiment of the present invention comprises a pipeline structure, in which several operations are performed based on a clock signal. It is to be understood that each stage of the pipeline structure operates during one period of a clock signal. In addition, each process illustrated in the flowchart 700 is performed during one period of a clock signal.

Alternatively, each stage of the pipeline can operate during more than one period of the clock signal. In other words, the time required for an operation corresponding to each process may by several clock cycles. Several processes illustrated by the method 700 may also be performed during one period of a clock signal.

As a result of the determination in process 720, when process 730 does not have to be performed, process 740 is not performed at a stage of the pipeline structure corresponding to process 730. In this case, no operation is performed at the stage of the pipeline structure corresponding to process 730. Thus, when commands for operations are continuously received at each stage of the pipeline structure, operations associated with the pipeline structure are smoothly performed.

When the data read operation is performed, process 740 may also include transmitting the read data to a transmitting unit corresponding to a sub-memory block inside a memory block, transmitting the data transmitted to the transmitting unit to an output buffer, and outputting the data transmitted to the output buffer to the outside.

In the IC 200, a data path in which data is read from the sub-memory block and output to the outside of the IC 200 is longer than a path of the data memory block or the tag memory controlling unit 210. It is to be understood that the structure of the IC according to an exemplary embodiment of the present invention is not limited to the structure shown in FIG. 2. Even though the IC according to an exemplary embodiment of the present invention may have different structures, the data path in which data is read from the sub-memory block and output to the outside of the IC is longer than the path of the data memory block or the tag memory controlling unit. Thus, the data read operation of process 740 is performed during two cycles of the clock signal so that the period of the clock signal can be reduced.

In accordance with the present invention, during an initial cycle of a clock signal, data is read by activating a word line and a column line of the sub-memory block, and the read data is transmitted to the transmitting unit corresponding to the sub-memory block. Here, the transmitting unit may be a sense amplifier circuit. During a subsequent cycle of the clock signal, the read data latched to the transmitting unit (or sense amplifier circuit) is transmitted to the output buffer. A memory block having a plurality of sub-memory blocks has a relatively high density and has a wide range. Thus, in the memory block, during two cycles of the clock signal, the read data is transmitted to the output buffer so that the period of the clock can be reduced. The data transmitted to the output buffer is output to the outside of the IC during the next cycle of the clock signal.

Figure 8:
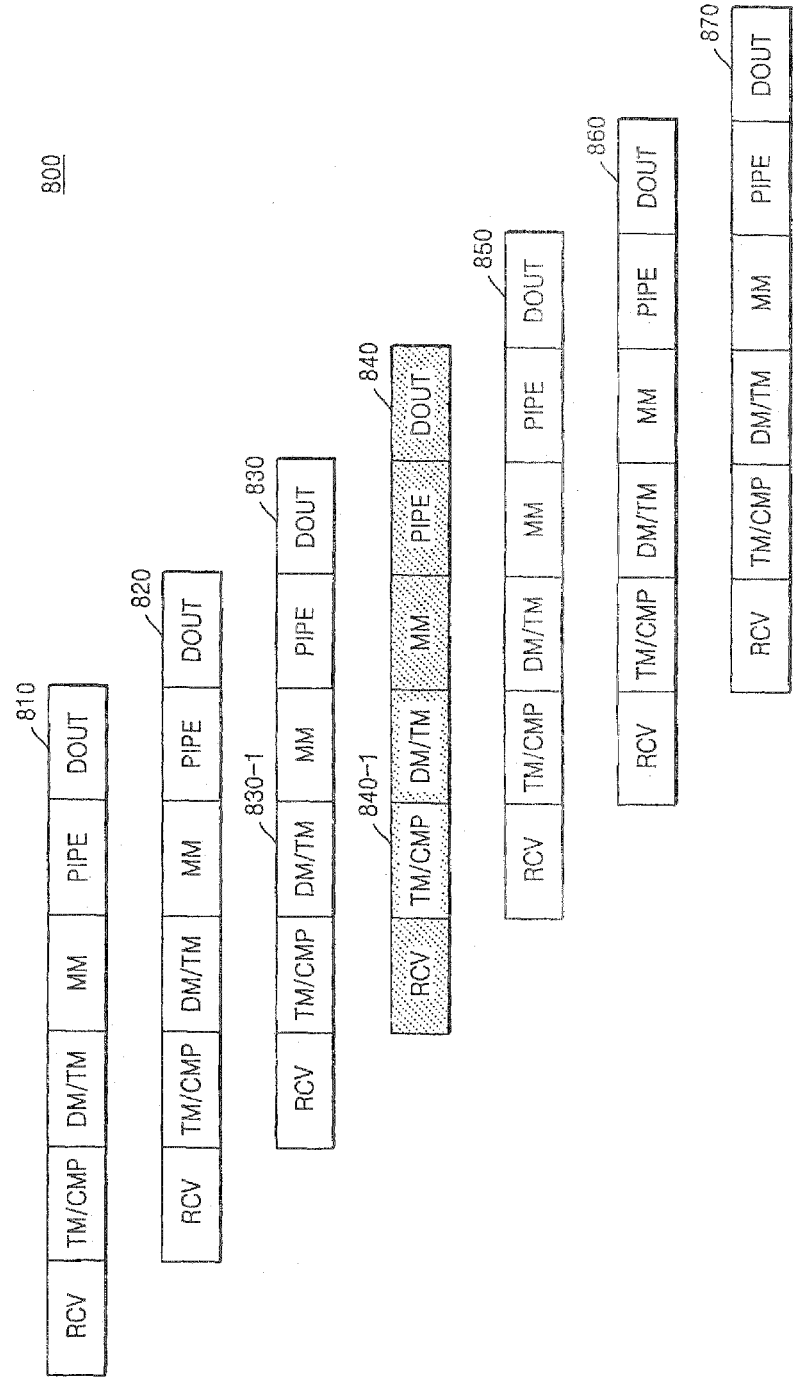
FIG. 8 is a pipeline structure illustrating an operation for controlling the IC of FIG. 7 according to an exemplary embodiment of the present invention.

FIG. 8 is a pipeline structure 800 illustrating an operation for controlling of the IC of FIG. 7 according to an exemplary embodiment of the present invention. As shown in FIG. 8, the pipeline structure 800 comprises pipelines 810–870. Referring to FIG. 8, RCV represents an operation in which a read address, a write address, and write data are received and stored in an internal register (not shown). TM/CMP represents an operation in which a tag memory controlling unit such as the tag memory controlling unit 210 is retrieved, in which it is determined whether a data write or read operation is performed in a data memory block using a write address or a read address.

DM/TM represents an operation in which, if it is determined in the TM/CMP operation that access to the data memory block is needed, access to the data memory block is performed, and if information needs to be updated by the tag memory controlling unit 210, the information is updated by the tag controlling unit 210.

MM represents an operation in which, if it is determined in the TM/CMP operation that access to a sub-memory block is needed, access to the sub-memory block is performed. The data write operation is terminated in this process, and when the data read operation is performed, the read data is transmitted to a sense amplifier circuit corresponding to the sub-memory block.

PIPE represents an operation, which is performed only if the data read operation is performed in MM and in which data latched to the sense amplifier circuit is transmitted to the output buffer. DOUT represents an operation in which, when the data read operation is performed, data stored in the output buffer is output to the outside.

It is to be understood that the operation of process 710 corresponds to RCV, the operation of process 720 corresponds to TM/CMP, the operation of process 730 corresponds to DM/TM, and the operation of process 740 corresponds to MM and PIPE.

The pipeline structure 800 will now be described assuming the processes 710–730 are performed during one period of the clock signal and the operation of process 740 is performed during two periods of the clock signal. It is to be further understood that in this example, a pipeline 840 represents that the IC 200 operates in response to a current clock signal, a pipeline 830 represents that the IC 200 operates in response to a previous clock signal.

An operation using the tag memory controlling unit 210 is performed at a TM/CMP stage and a DM/TM stage. At the TM/CMP stage, a data read operation is performed by the tag memory controlling unit 210 during the first half of the cycle of the clock signal, and at the DM/TM stage, a data write operation is performed by the tag memory controlling unit 210 during the latter half of the cycle of the clock signal. Unlike memory blocks or data memory blocks having a plurality of sub-memory blocks, the tag memory controlling unit 210 is placed in the center of the IC 200, and the size of a cell array is reduced such that the data read operation and the data write operation can be performed during the first half and latter half of one cycle of the clock signal.

In the operation performed at the TM/CMP stage of the pipeline 840, when the data read operation is performed by the tag memory controlling unit 210, the result of the command of the previous cycle is not written in (or updated by) the tag memory controlling unit 210. In operations (or stages) 840-1 and 830-1 of the pipelines 840 and 830, respectively, the operation of writing data in the tag memory controlling unit 210 of the operation 840-1 is performed later than the operation of reading data from the tag memory controlling unit 210 of the operation 830-1. Thus, if the write address for a data write operation 830-1 during the previous cycle of the clock signal is the same as the read address for the data read operation 840-1 during a current cycle of the clock signal, the data read from the tag memory controlling unit 210 may not be correct data. Thus, when the data read from the tag memory controlling unit 210 at the TM/CMP stage is written in the same address of the tag memory controlling unit 210 at the next stage DM/TM, the address and data to be written in the tag memory controlling unit 210 are stored in a predetermined register (not shown).

If a newly-input write address or read address is coincident with the address stored in the register, a subsequent operation is performed using the data stored in the register. In a case where the upper addresses of the received write address and read address are the same, the read address and the write address are not the same as a predetermined data memory address, and data stored in the data memory block corresponding to the write address is valid is referred to as thrashing.

An operation when thrashing occurs will be described below. If thrashing occurs, process 730 includes reading the data stored in the data memory block corresponding to the write address and writing write data corresponding to the write address in the data memory block from which the data is read. In addition, process 740 includes performing a data read operation in the sub-memory block corresponding to the read address and writing the read data in the sub-memory block in which the data read in the process of reading data stored in the data memory block corresponding to the write address is to be originally stored.

If the upper addresses of the write address and the read address are the same, the data write operation and the data read operation should be performed in the same sub-memory block. However, the data read operation is performed in the sub-memory block and the data write operation is performed in the data memory block. In this case, in order to write data in the data memory block, it is first determined whether the data stored in the data memory block is valid. Whether the data stored in the data memory block is valid can be seen by reading data from the tag memory controlling unit 210 corresponding to the write address at the TM/CMP stage. It is to be understood that the data of the tag memory controlling unit 210 is comprised of valid bits determining whether the upper address of the data stored in the data memory block and the data are valid, and thus, can be seen from the valid bits.

If the data stored in the data memory block is not valid, data to be currently written is written in the data memory block, and information on data written in the data memory block is updated by the tag memory controlling unit 210. In the updating operation, the information containing the upper address of the data newly written in the data memory block and valid data are written in the tag memory controlling unit 210. If the data stored in the data memory block is valid, thrashing occurs. In this case, the IC operates as follows.

At the DM/TM stage, the data stored in the data memory block is read, and new data is written. Since the data read operation and the data write operation for the same address are performed, two operations can be performed during one cycle of the clock signal. Simultaneously, information related to the data written in the data memory block is updated by the tag memory controlling unit 210.

At the MM stage, the data read operation is performed in the sub-memory block from which data is to be originally read, and simultaneously, the read data is written in the sub-memory block in which data read from the data memory block during the previous cycle of the clock signal was to be originally stored. The sub-memory block in which the data read from the data memory block is written is different from the sub-memory block in which the data is to be originally read.

Thus, the data write operation and the data read operation can be simultaneously performed, and when thrashing occurs, if the data stored in the data memory block is intended to be transferred to the sub-memory block, a period of the clock signal is not affected.

As described above, a method of controlling an operation of an IC having a memory cell array configuration, which is capable of simultaneously performing a data read operation and a data write operation so that a period of a clock signal is reduced is provided. According to the present invention, the operation of the IC is controlled such that data is smoothly read to or written from the memory blocks inside the IC without affecting the period of the clock signal.

While this invention has been particularly shown and described with reference to exemplary embodiments thereof, it will be understood by those skilled in the art that various changes in form and details may be made therein without departing from the spirit and scope of the invention as defined by the appended claims and equivalents thereof.

What is claimed is:

1. A method of controlling an integrated circuit (IC) to which inputs and outputs (I/Os) are separately provided and to which a write address and a read address are simultaneously input during one period of a clock signal and which comprises memory blocks, each of the memory blocks comprising sub-memory blocks, data memory blocks corresponding to the memory blocks, and a tag memory, controlling unit, the method comprising:
    (a) receiving a write address, a read address, and write data;
    (b) determining, in which sub-memory block of the sub-memory blocks and in which data memory block of the data memory blocks a data read operation and a data write operation are to be performed in response to the write address and the read address by using the tag memory controlling unit;
    (c) performing the data read operation or the data write operation in the data memory block according to the determination of step (b); and
    (d) performing the data read operation or the data write operation in the sub-memory block according to the determination of step (b).

2. The method of claim 1, wherein step (d) further comprises:
    (d1) when the data read operation is performed, transmitting the read data to a transmitting unit corresponding to the sub-memory block;
    (d2) transmitting the data to an output buffer; and
    (d3) outputting the data transmitted to the output buffer.

3. The method of claim 2, wherein steps (a) through (d) each represent a stage of a pipeline in a pipeline structure in which an operation of the IC is performed.

4. The method of claim 3, wherein at least one stage operates during one period of a clock signal or during several periods of the clock signal.

5. The method of claim 4, wherein step (c) further comprises:
    writing information regarding the data read or write operation performed in the data memory block to the tag memory controlling unit.

6. The method of claim 5, wherein in step (b), the information and an address of a tag memory in which the information is to be written are temporarily stored in a register before the information is written to the tag memory controlling unit.

7. The method of claim 6, wherein in step (b), when a newly received write or read address is coincident with the address of the tag memory in which the information is to be written, a subsequent operation is performed using the information stored in the register.

8. The method of claim 3, wherein as a result of step (b), when the operation of step (c) is not performed, the operation of step (d) is not performed at a stage corresponding to step (c), and no operation is performed at the stage corresponding to step (c).

9. The method of claim 1, wherein if upper addresses of the received write address and read address are the same, the read address and the write address are not the same as a data memory address and data stored in the data memory block corresponding to the write address is valid, step (c) further comprises:
    (c1) reading data stored in the data memory block corresponding to the write address; and
    (c2) writing write data corresponding to the write address to the data memory block from which the data is read; and
    step (d) further comprises:
    (da) performing a data read operation in a sub-memory block corresponding to the read address; and
    (db) writing the read data to a sub-memory block corresponding to the data memory block in which data read in step (c1) is stored.

10. The method of claim 9, wherein step (c2) further comprises (c21) writing the information regarding the write data written to the data memory block from which the data is read to the tag memory controlling unit.

11. The method of claim 9, wherein the data memory address is an address of the sub-memory block corresponding to the data memory block.

12. The method of claim 1, wherein the tag memory controlling unit writes data to the memory blocks or the data memory blocks or reads data from the memory blocks or the data memory blocks in response to the write address or the read address.

13. A method for performing a write operation and a read operation in an integrated circuit (IC) comprising a separate input and output (I/O), first memory location, each of the first memory location, comprising third memory location, second memory locations corresponding to the first memory locations, and a memory controlling unit, the method comprising:

receiving a write address, a read address and a write data command during a period of a clock signal;

determining, a third memory location of the third memory locations and a second memory location of the second memory locations, where a write operation and a read operation are to be performed in response to the write address and the read address by using the memory controlling unit; and performing the write operation in one of the third memory location and the second memory location and the read operation in one of the third memory location and the second memory location.

14. The method of claim 13, wherein a first memory location of the first memory locations is a memory block, the second memory location is a data memory block and the third memory location is a sub-memory block.

15. The method of claim 13, wherein the determination step further comprises:

determining if the write address and the read address are input;

determining if an upper address of the write address is coincident with an upper address of the read address;

determining if the write address and the read address are coincident with a data memory address; and determining if data stored in one of a first memory location of the first memory locations and the second memory location is valid data.

16. The method of claim 15, wherein the performing step further comprises:

performing the write operation or the read operation in one of the first memory location and the second memory location, when the operation to be performed corresponds to the address coincident with the data memory address;

performing the read operation in one of the first memory location and second memory location, when the write address and the read address are coincident with the data memory address;

storing new data in one of the first memory location and the second memory location, when data stored in one of the first memory location and the second memory location is valid data; and writing the new data to one of the first memory location and the second memory location, when data stored in one of the first memory location and the second memory location is not valid data.

17. The method of claim 15, wherein the performing step further comprises:

performing the write operation or the read operation in the third memory location, when the operation to be performed corresponds to the address not coincident with the data memory address;

performing the write operation in the third memory location, when the write address and the read address are coincident with the data memory address;

storing new data in one of the first memory location and the second memory location, when data stored in one of the first memory location and the second memory location is valid data; and writing the new data to one of the first memory location and the second memory location, when data stored in one of the first memory location and the second memory location is not valid data.

* * * * *